(12) United States Patent
Ramaraju et al.

(10) Patent No.: US 8,484,523 B2
(45) Date of Patent: Jul. 9, 2013

(54) SEQUENTIAL DIGITAL CIRCUITRY WITH TEST SCAN

(75) Inventors: Ravindraraj Ramaraju, Round Rock, TX (US); Prashant U. Kenkare, Austin, TX (US); Gary A. Mussemann, Austin, TX (US); Mihir S. Sabnis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 456 days.

(21) Appl. No.: 12/729,826

(22) Filed: Mar. 23, 2010

(65) Prior Publication Data

US 2011/0239069 A1    Sep. 29, 2011

(51) Int. Cl.
*G01R 31/28* (2006.01)
(52) U.S. Cl.
USPC .......................................................... 714/731
(58) Field of Classification Search
USPC ........................................... 714/731, E11.155
See application file for complete search history.

(56) References Cited

U.S. PATENT DOCUMENTS

| | | | |
|---|---|---|---|
| 5,689,517 A * | 11/1997 | Ruparel | 714/731 |
| 5,812,561 A | 9/1998 | Giles et al. | |
| 6,708,303 B1 | 3/2004 | Gallia | |
| 6,788,105 B2 | 9/2004 | Kono | |
| 6,794,898 B2 | 9/2004 | Komaki | |
| 6,986,089 B2 | 1/2006 | Hill et al. | |
| 7,038,494 B2 | 5/2006 | Morton | |
| 7,559,041 B2 | 7/2009 | Watanabe et al. | |
| 7,596,732 B2 | 9/2009 | Branch et al. | |
| 7,840,864 B2 * | 11/2010 | Grise et al. | 714/726 |
| 2004/0075479 A1 | 4/2004 | Gupta | |
| 2004/0078741 A1 * | 4/2004 | Morton | 714/726 |
| 2005/0216806 A1 | 9/2005 | Verwegen | |
| 2006/0107074 A1 * | 5/2006 | Tang et al. | 713/300 |
| 2007/0268053 A1 | 11/2007 | Vig et al. | |
| 2007/0283201 A1 * | 12/2007 | Grise et al. | 714/724 |
| 2008/0215940 A1 * | 9/2008 | Burlison et al. | 714/726 |
| 2008/0270861 A1 * | 10/2008 | Lackey | 714/731 |

OTHER PUBLICATIONS

Title: On zero clock skew hold time failure in scan test; Author(s): Xiaonan Zhang; Qualcomm, Inc., San Diego, CA, USA Solid-State and Integrated-Circuit Technology, 2008. ICSICT 2008. 9th International Conference on Date of Conference: Oct. 20-23, 2008 pp. 2070-2074.*

* cited by examiner

*Primary Examiner* — Ajay Bhatia
*Assistant Examiner* — Thien D Nguyen
(74) *Attorney, Agent, or Firm* — James L. Clingan, Jr.

(57) ABSTRACT

A digital scan chain system having test scan has a plurality of flip-flop modules, each of the plurality of flip-flop modules having a first data bit input, a second data bit input, a test bit input, a clock input, a first data bit output, a second data bit output, and a test bit output. The test bit output of a first flip-flop module is directly connected to the test bit input of a second flip-flop module with no intervening circuitry. First and second multiplexed master/slave flip-flops are directly serially connected. A clocked latch is coupled to the output of the second multiplexed master/slave flip-flop and provides the test bit output. The clocked latch is clocked only during a test mode to save power.

16 Claims, 7 Drawing Sheets

US 8,484,523 B2

SEQUENTIAL DIGITAL CIRCUITRY WITH TEST SCAN

BACKGROUND

1. Field

This disclosure relates generally to semiconductors, and more specifically, to digital logic circuitry.

2. Related Art

Digital circuits within integrated circuits are commonly designed using a standard cell design procedure. Circuits having predefined functions are referred to as cells and are arranged to form a desired global function. Standard cell designs achieve high integration and functionality and are therefore used for designing a system on chip (SOC). In the design process a functional block diagram is generated. A detailed functional description is generated using a hardware description language. The detailed functional description undergoes functional testing with a functional simulator. For logic design, the functional block diagram and the detailed functional description are converted to specific hardware to generate a logic diagram (netlist). Layout is performed where a circuit diagram is generated until a level enabling pattern of the logic expressed in the netlist is generated. A mask is then generated to wire and connect devices of the circuit diagram on the semiconductor substrate.

In a physical semiconductor device formed by this process, digital circuits such as flip-flops do not function accurately unless a setup time and a hold time are satisfactory. A setup time is the time required to present a data signal and maintain it before another signal is presented, and a hold time is an amount of time for which a data signal must be held after a clock signal changes. On-Chip Variation (OCV) can cause random or systematic variation in clock signal delays across an SOC. Various clock signal delays are caused by conductor or wire characteristics, such as resistance, capacitance, process, voltage and temperature variation. Signal delays also occur when a signal passes through a logic gate. When a data delay or clock delay occurs due to these natural characteristics, normal synchronous operations of flip-flops are affected and timing violations may occur, such as setup time violations and data hold violations.

In conventional circuit design processes, wire delays that may occur are predicted after layout. Then, timing analysis is performed based on the predicted wire delay, to determine where timing violations may occur so that changes may be made to the circuit to satisfy the required timing. Existing circuits which address flip-flop hold timing do so with the tradeoff of adding a significant amount of circuitry which is undesirable. The additional circuitry which functions to address setup and hold timing constraints also increases power consumption to an amount that is very undesirable for integrated circuits used in power-aware applications.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

There is disclosed herein sequential digital circuitry having scan test circuitry which is size efficient and power efficient. The sequential digital circuitry described herein is optimized to reduce sensitivity to clock skew (i.e. the variation of clock arrival times at different sequential elements in the digital circuit) while saving circuit area and reducing power consumption. Switching power in a test path is eliminated during a functional mode of operation to reduce overall power consumption.

Figure 1:
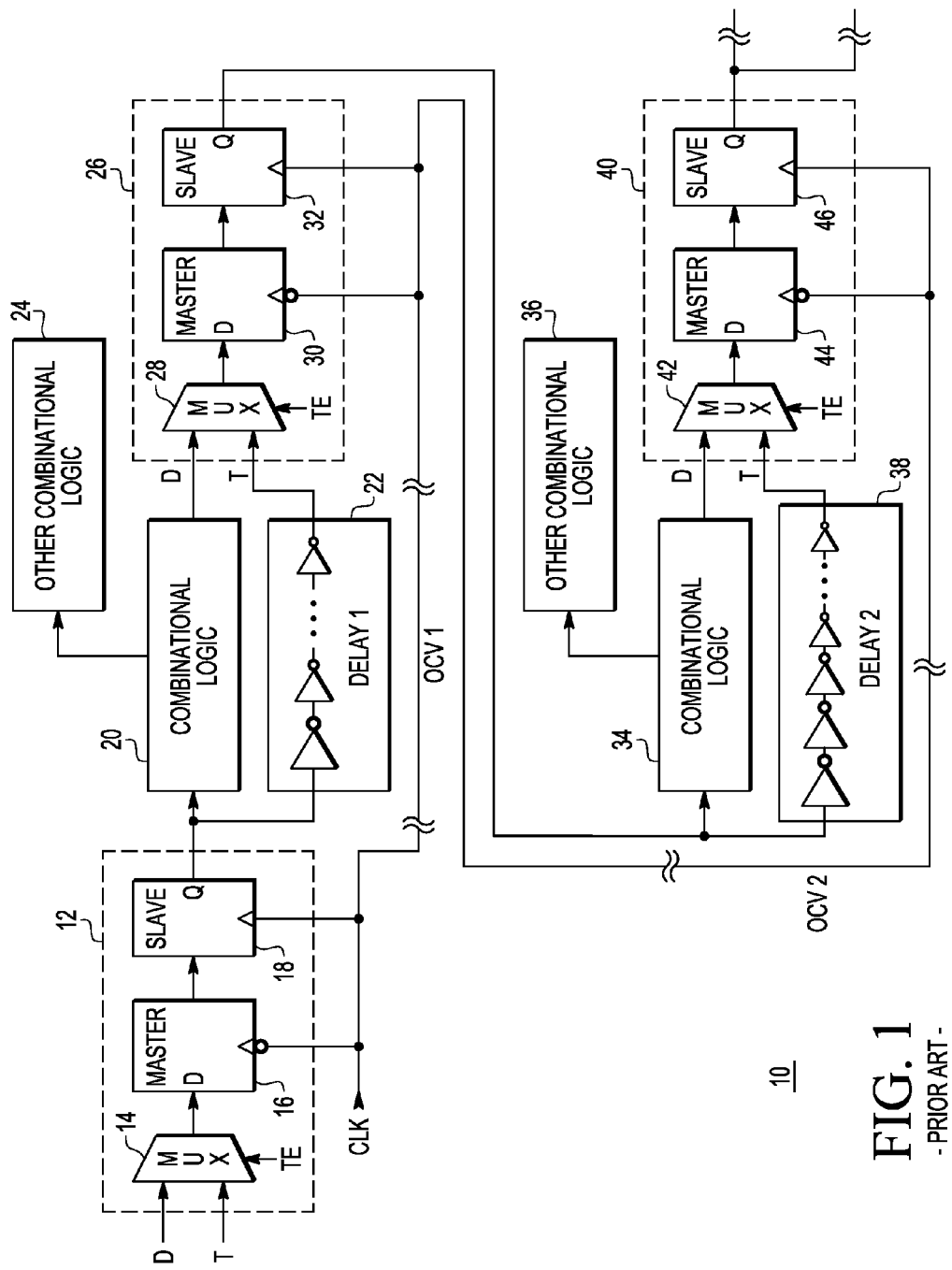
FIG. 1 illustrates in block schematic form a digital circuit having flip-flops with a single clock domain that is known in the art.

Illustrated in FIG. 1 is a known digital circuit 10 having both a scan test chain and a data path and using a single clock domain that is clocked by a signal called CLK. The design process generally aims to avoid clock skew between the various flip-flops 12, 26 and 40 which exist within a single clock domain such as that shown in digital circuit 10. In an ideal case, the avoidance of clock skew would ensure that the CLK signal arrives at multiplexed flip-flops 12, 26 and 40 at virtually the same time. However, variable clocking delays resulting from OCV ensure that the CLK signal will exhibit varying degrees of clock skew in fabricated silicon. This variation in clock arrival times is shown in FIG. 1 as OCV1 and OCV2, and is directly responsible for worsening hold margin of the test path. In the prior art, an undesired outcome of this clock skew is the required addition of delay elements 22 and 38 as shown in FIG. 1. A more detailed description of the digital circuitry in FIG. 1 follows. A multiplexed flip-flop 12 has a multiplexer 14 (Mux 14) having a first input for receiving a data bit D and a second input for receiving a test bit T. A control terminal of the multiplexer 14 receives a test enable signal, TE, for controlling which of the two inputs is provided to a D input of a master latch 16. An output of the master latch 16 is connected to an input of a slave latch 18. A Q output of the slave latch 18 is connected to an input of combinational logic 20 and to an input of a delay circuit 22. The delay circuit 22 is implemented by a first plurality of series-connected inverters and implements a first predetermined delay. A first output of the combinational logic 20 is connected to an input of other combinational logic 24. A second output of the combinational logic 20 provides a data bit D and an output of the delay circuit 22 provides a test bit T. The master latch 16 and slave latch 18 are clocked by a clock signal, CLK. The clock signal is connected to an active low clock input of the master latch 16 and an active high input of the slave latch 18. The clock signal which is routed in the area of the delay circuit 22 and combinational logic will have a differing clock skew and thus different on-chip variation (OCV1) due to additional conductive routing. A second multiplexed flip-flop 26 is connected in series with the combinational logic 20 and the delay circuit 22. Flip-flop 26 has a multiplexer 28 having a first input connected to the data bit D from the combinational logic 20. A second input of multiplexer 28 is connected to the test bit T from the delay circuit 22. A control input of multiplexer 28 is connected to the test enable signal TE. An output of multiplexer 28 is connected to a D input of a master latch 30. An output of the master latch 30 is connected to an input of a slave latch 32. An output of slave latch 32 is connected to both an input of combinational logic 34 and to an input of a delay circuit 38. The delay circuit 38 implements a predetermined second delay and is implemented by a second number of inverter circuits which is typically different from the first number of inverter circuits of the delay circuit 22. The master latch 30 and slave latch 32 are clocked by the clock signal, CLK. The clock signal is connected to an active low clock input of the master latch 30 and an active high input of the slave latch 32. There is a clock skew variation (OCV2) between flip-flop 26 and flip-flop 40. An output of the combinational logic 34 provides a data bit D to a first input of a multiplexer 42 of a flip-flop 40. An output of the delay circuit 38 provides a test bit T to a second input of the multiplexer 42. An output of the multiplexer 42 is connected to a D input of a master latch 44. An output of the master latch 44 is connected to an input of a slave latch 46. An output of the slave latch 46 labeled Q is connected to additional circuitry (not shown) in the circuit 10. An active low clock input of master latch 44 is connected to the clock signal, and an active high clock input of slave latch 46 is connected to the clock signal.

In operation, multiplexer 14 couples a test bit T of known value to the master latch 16 and slave latch 18. The test bit T is clocked by a clock signal CLK. The slave latch 18 outputs the test bit T at the Q output and the test bit is passed through the combinational logic 20. Data generated with the combinational logic 20 is also routed to the other combinational logic 24. The output of the combinational logic 20 is routed to the first input of the multiplexer 28. The multiplexer 28 also receives the output of the slave latch 18 at the test bit input thereof. The clock signal is routed over to the multiplexed flip-flop 26 and encounters clock skew or clock variation, designated as OCV 1, due primarily to the physical resistance of the clock conductor. As described earlier, the impact of clock skew results in varying arrival times of the CLK signal at various flip-flops in digital circuit 10. For example, consider the case where OCV1 results in the CLK signal arriving later at flip-flop 26 as compared to flip-flop 12. The data D and test T inputs for flip-flop 26 may then need to be held longer relative to the case where the CLK signal arrived at the same time for both flip-flops 12 and 26. The larger hold time requirement for the D input of flip-flop 26 is satisfied by the propagation delay of combinational logic block 20 between the Q output of flip-flop 12 and the D input of flip-flop 26. However, the scan path typically has no combinational logic between the output of a first flip-flop 12 and the T input of a receiving flip-flop 26. Hence, there is a need to introduce propagation delay by adding a delay element 22 between the Q output of flip-flop 12 and the test input T of flip-flop 26. The propagation delay DELAY1 for delay element 22 is designed to ensure sufficient hold margin after accounting for clock skew OCV1. During a test set-up mode, the multiplexer 28 is enabled to pass the known value test bit T to the data input of the master latch 30. The data output of the slave latch 32 is coupled to the combinational logic 34 and takes an amount of time to serially be coupled as a data output of the multiplexer 42. Similar to the previously described impact of clock skew OCV1, the presence of clock skew OCV2 between flip-flops 26 and 40 necessitates the addition of delay element 38 between the Q output of flip-flop 26 and the T input of flip-flop 40. While the data value is being generated by the combinational logic 34, the delay circuit 38 must delay the data output of slave latch 32 and present the data as the test bit to the multiplexer 42. In the test set-up mode the multiplexer 42 is configured to couple the test bit to the data input of the master latch 44. The slave latch 46 outputs the test bit as a data value which can be verified to determine if it has a correct digital value. The output of the slave latch 46 is similarly coupled to additional series of combinational logic and delay circuitry (not shown). A data mode is then entered wherein the TE signal is not active and the multiplexers 14, 28 and 42 pass the data input. In this manner the circuit 10 functions as a serial data chain of combinational logic which can be selectively tested with a known value test bit for accuracy. Because the combinational logic 20 and combinational logic 34 typically represent a significant amount of circuitry and delay, the hold time requirement at the input signal D of the flip-flops 26 and 40 is not affected by launch of new data at the output of flip-flops 12 and 26, respectively. Because the outputs of the flip-flops 12 and 26 are respectively connected directly to the test input of the flip-flops 26 and 40 without any intervening combinational logic in the signal path, the hold time requirement at test input T of the flip-flops 26 and 40 can be affected by launch of new data at the output of flip-flops 12 and 40, respectively, due to on-chip variation of the clock signal. To avoid the failure of hold time requirement, the delay circuits 22 and 38 should have a significant amount of delay to avoid the hold time failure. The addition of hold-related delay can represent a large amount of circuit area in a system having multiple serial stages of digital logic. The significant increase in circuitry also creates a significant increase in power consumption for the circuit. Additionally, when dealing with a series of combinational logic circuits, the on-chip variation (OCV) of the clock signal is significant and may interfere with the desired set-up and hold-times of the latches. As a result of the clock skew, the hold time requirement might not be met during the test mode making the test mode inoperable irrespective of the clock frequency. Therefore it is important that the delay circuits 22 and 38 have a sufficient amount of delay across process, voltage and temperature variation to prevent a non-repairable test mode failure. It should be noted that the propagation delay DELAY1 for delay element 22 is not necessarily the same as propagation delay DELAY2 for delay element 38. DELAY1 and DELAY2 are respectively designed for the corresponding clock skew variation OCV1 and OCV2.

Another concern with the implementation of digital circuit 10 is associated with the design process used to create digital circuit 10. The amount of delay needed in each of delay circuit 22, delay circuit 38, and others, is not accurately determined until place and routing functions of the other digital circuitry has occurred. At that point in the semiconductor design cycle, a determination of the amount of delay circuit can be reasonably determined. However, insertion of the delay circuitry requires modification of a layout which can result in an inefficient layout and wasted die area which increases the cost of the product using digital circuit 10.

Figure 2:
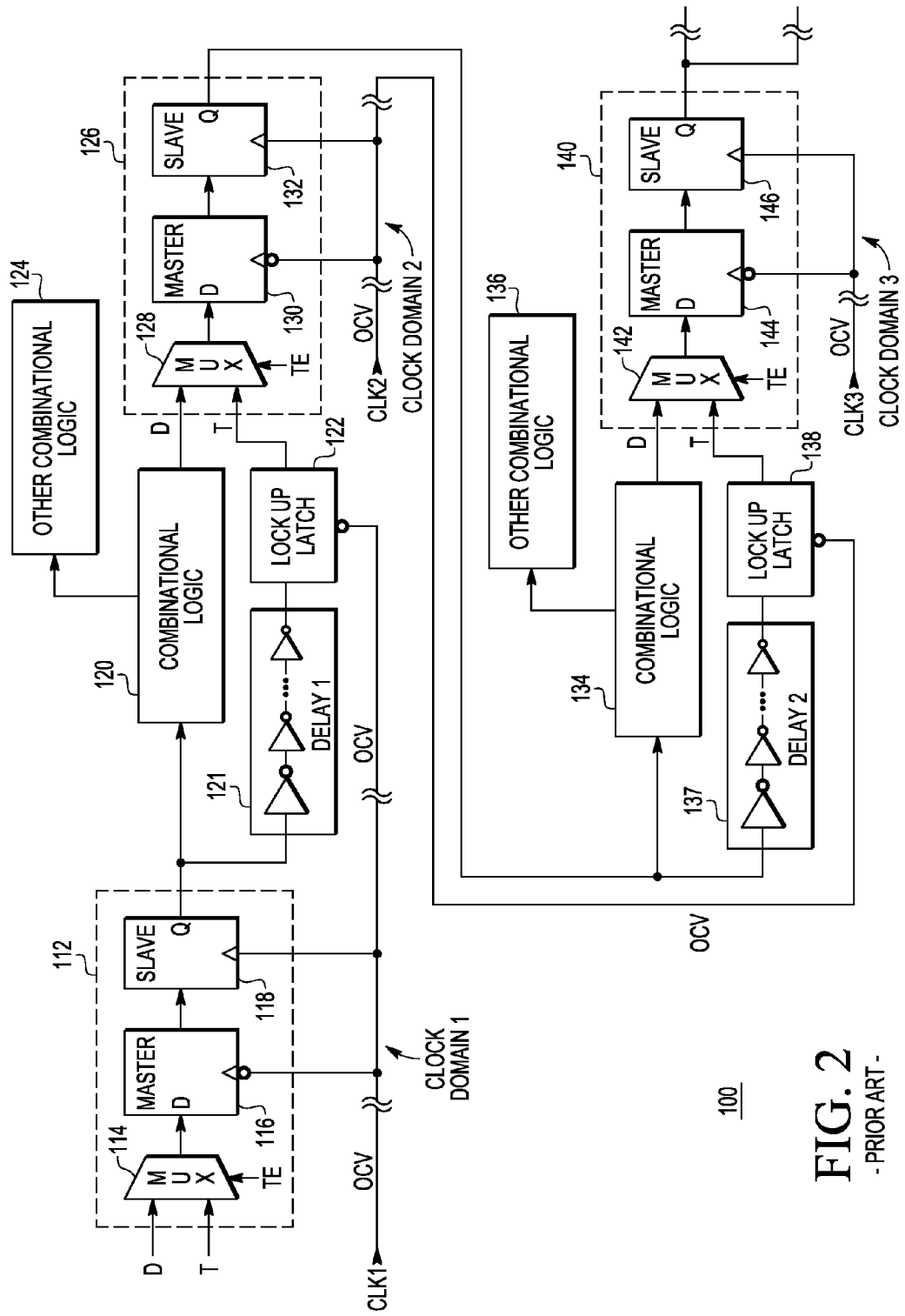
FIG. 2 illustrates in block schematic form a digital circuit having flip-flops with multiple clock domains that is know in the art.

Illustrated in FIG. 2 is another known digital circuit in the form of digital circuit 100 which has both a scan test chain and a data path and uses multiple clock domains. A multiplexed flip-flop 112 has a multiplexer 114 having a first input for receiving a data bit D and a second input for receiving a test bit T. A control terminal of the multiplexer 114 receives a test enable signal, TE, for controlling which of the two input bits is provided to a D input of a master latch 116. An output of the master latch 116 is connected to an input of a slave latch 118. A Q output of the slave latch 118 is connected to an input of combinational logic 120 and to an input of a delay circuit 121 for providing a first delay, Delay 1. The delay circuit 121 in one form is implemented by a first plurality of series-connected inverters. An output of the delay circuit 121 is connected to an input of a lock up latch 122. An output of the combinational logic 120 is connected to an input of other combinational logic 124. A data bit D is connected to a first input of multiplexer 128 of a second multiplexed flip-flop 126. An output of the lock up latch 122 provides a test bit T. The master latch 116 and slave latch 118 are clocked by a first clock signal, CLK1, provided by a first clock domain. The CLK1 clock signal is connected to an active low clock input of the master latch 116, to an active high input of the slave latch 118 and to an active low input of the lock up latch 122.

A second multiplexed flip-flop 126 is connected in series with the lock up latch 122. Flip-flop 126 has a multiplexer 128 having a first input connected to a data bit D. A second input of multiplexer 128 is connected to the test bit T from the lock up latch 122. A control input of multiplexer 128 is connected to the test enable signal TE. An output of multiplexer 128 is connected to a D input of a master latch 130. An output of the master latch 130 is connected to an input of a slave latch 132. An output of slave latch 132 is connected to both an input of combinational logic 134 and to an input of a delay circuit 137 for providing a second delay, Delay 2. The delay circuit 137 in one form is implemented by a first plurality of series-connected inverters. An output of the delay circuit 137 is connected to an input of a lock up latch 138. The master latch 130, slave latch 132 and lock up latch 138 are clocked by a second clock signal, CLK2, from a second clock domain. The clock signal is connected to an active low clock input of the master latch 130 and lock up latch 138 and to an active high input of the slave latch 132. An output of the combinational logic 134 is connected to other combinational logic 136.

A flip-flop 140 which operates in a third clock domain is connected in series with the lock up latch 138. A data bit D is connected to a first input of a multiplexer 142. An output of the lock up latch 138 provides a test bit T to a second input of the multiplexer 142. An output of the multiplexer 142 is connected to a D input of a master latch 144. An output of the master latch 144 is connected to an input of a slave latch 146. An output of the slave latch 146 labeled Q is connected to additional circuitry (not shown) in the circuit 100. An active low clock input of the master latch 144 is connected to a third clock signal, CLK3, of the third clock domain. An active high clock input of the slave latch 146 is connected to the clock signal.

In operation, the digital circuit 100 does not eliminate the use of a large number of inverters which form multiple delay circuits that are used in digital circuit 10 of FIG. 1. In addition to using delay circuits, a lock-up latch, such as lock-up latches 122 and 138, is implemented in parallel with the combinational logic. Separate clock domains may represent different functional blocks in a System-On-Chip (SOC) and each clock domain can be operating in different clock frequencies independent of each other. The lock-up latches 122 and 138 are continually powered and create a significant amount of power dissipation. In addition, there is now the added constraint of OCV induced clock skew between a launching flip-flop, such as flip-flop 112, and a receiving lock-up latch, such as the lock-up latch 122 which still requires the use of delay circuit 121. By using the lock up latch 122, the size of the delay circuit 121 may be made smaller than delay circuit 22 of FIG. 1 because less delay is needed in the test scan path in the FIG. 2 circuit. However, the need for delay circuit 121 means that the circuitry must again be added late in the design layout stage and results in the inefficiencies mentioned above in connection with FIG. 1. Furthermore, there is clock skew (i.e. OCV) associated with the clock signal feeding into a flip-flop, such as CLK1 feeding into flip-flop 112. Specifically, automated place and route design flows can result in the lock-up latch being at a large enough physical distance from the launching flip-flop to increase the magnitude of clock skew. The noted concerns associated with digital circuit 10 also exist with the digital circuit 100. Until place and route functions have occurred, the serial test connection between the flip-flops 112, 126 and 140 are not known. Each flip-flop 112, 126 and 140 is in a separate and different self-contained clock domain. Therefore, an additional processing step of inserting lock-up latches and delay circuits is required in the semiconductor cycle, which modifies the semiconductor layout and requires extra design cycle time.

Figure 3:
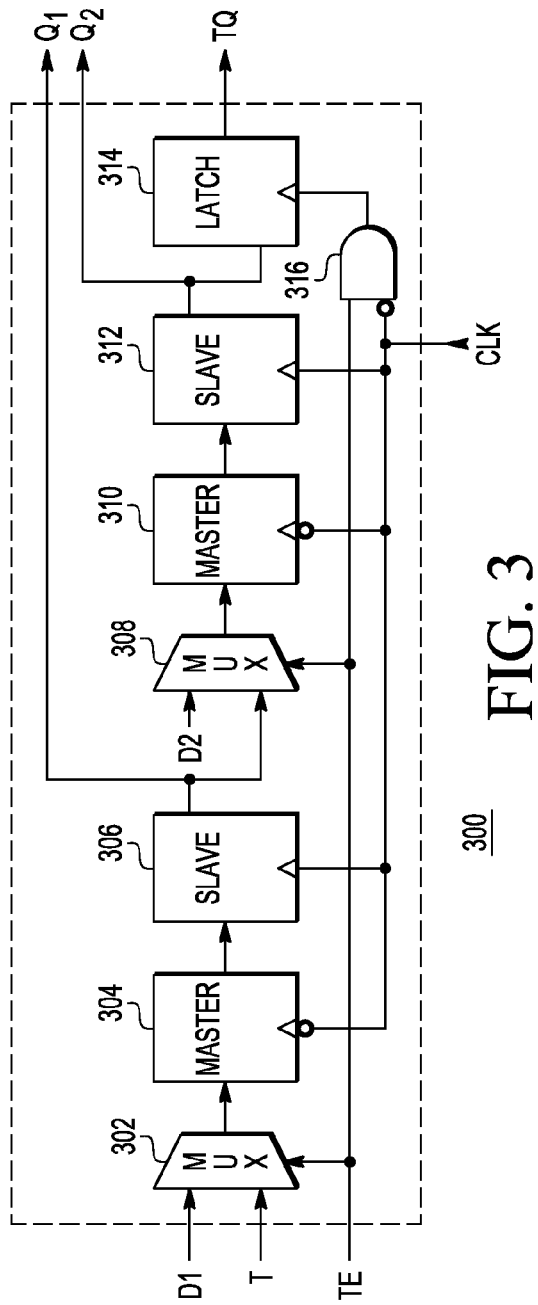
FIG. 3 illustrates in block schematic form a module of a multiplexed flip-flop with a latch in accordance with principles of the present invention.

Illustrated in FIG. 3 is a flip-flop module circuit 300 for use in sequential digital circuitry with test. A first data bit, D1 is connected to a first input of a multiplexer 302. A second input of multiplexer 302 receives a test bit T. A control input of the multiplexer 302 receives a test enable signal, TE. An output of the multiplexer 302 is connected to an input of a master latch 304. An output of the master latch 304 is connected to an input of a slave latch 306. An output of the slave latch 306 provides a first data output labeled Q1. A first input of the multiplexer 308 is connected to a data bit D2. The first data output labeled Q1 is connected to a second input of a multiplexer 308. An output of the multiplexer 308 is connected to an input of a master latch 310. An output of the master latch 310 is connected to an input of a slave latch 312. An output of the slave latch 312 provides a second data output labeled Q2 and is connected to an input of a latch 314. An output of the latch 314 provides a test output labeled TQ. The test enable signal is also connected to a control input of the multiplexer 308 and to a first input of an AND gate 316. A clock signal, CLK, is connected to active low clock inputs of the master latch 304 and the master latch 310 and to an active low second input of the AND gate 316. As discussed below, a clock signal input pin or terminal is physically positioned to be closer to the active low second input of the AND gate 316 than to the clock inputs of the master latches and slave latches. The clock signal, CLK, is also connected to active high clock inputs of the slave latch 306 and the slave latch 312. An output of the AND gate 316 is connected to a clock input of the latch circuit 314. The multiplexer 302, master latch 304 and slave latch 306 form a first multiplexed master/slave flip-flop. The multiplexer 308, master latch 310 and slave latch 312 form a second multiplexed master/slave flip-flop.

In operation, the flip-flop module circuit 300 functions as a module with a hold latch at the output. The flip-flop module circuit 300 has a single test bit input while two separate data bits are provided for use by separate combinational logic circuits in a system. The hold latch, latch 314, at the output is conditionally clocked only when the test enable signal, TE, is asserted during the test mode. The flip-flop module circuit 300 also uses a single clock and avoids a need to generate multiple clocks. The clock skew that results from the single clock is managed by the design of the flip-flop module circuit 300. The flip-flop module circuit 300 has both a test set-up mode of operation and a functional mode of operation. In the test set-up mode the test enable signal is asserted to allow multiplexer 302 to pass the test bit T which has a predetermined value. The multiplexer 308 passes the output of the slave latch 306. The clock signal sequentially clocks the test bit through the master latch 304 and slave latch 306 and multiplexer 308 enables the test bit to be clocked through the master latch 310 and slave latch 312. In response to the test enable signal being active, the latch 314 is enabled by the AND gate 316 to latch the output of the slave latch 312 as a test output bit TQ. The test output bit TQ can be checked to determine if it has an expected value in response to the known test input bit value. In the functional mode of operation, the multiplexers 302 and 308 are controlled by the inactive test enable TE signal to respectively pass two separate data bits, D1 and D2 to respective master latches 304 and 310. The master latch 304 is clocked to pass data bit D1 to the slave latch 306 which is clocked to output the data bit D1 as data bit Q1. The clocking of the latches in the flip-flop module circuit 300 is accomplished, in one form, on rising edge clock transitions. The master latch 310 is clocked to pass data bit D2 to the slave latch 312 which is clocked to output the data bit D2 as data bit Q2. The gating of the latch 314 with the test enable signal via AND gate keeps the latch 314 from being switched during the functional mode of operation and thereby eliminates switching power of the latch from being consumed. It should be noted that the flip-flop module circuit 300 provides predictability in meeting the hold time requirement of the master latch 310 during the test mode by design. Because a common clock signal is used within the module, the clock skew between the slave latch 306 and master latch 310 is minimized and the new data launched at the output of slave latch 306 is designed to arrive at the test input of master latch 310 after the required hold time for the previous data.

In one form the physical layout of the flip-flop module circuit 300 can also assist to minimize affects of clock skew. In this form because the clock signal input is placed closer to the AND gate 316 than to other clock inputs of the master latches and slave latches, the clock signal transitions earlier at the AND gate 316 and is conditioned to more quickly clock the latch 314. Clock skew at the clock input of master latch 304 will be the longest of all affected clocks and will be the determining factor for beginning the serial clocking of a data bit or test bit through the flip-flop module circuit 300. Thus the hold time for latch 314 is more accurately guaranteed even though there is some clock skew associated with the physical clock conductor of the flip-flop module circuit 300. The clock skew is used as an advantage to assist with meeting the hold-time requirements in the flip-flop module circuit 300. In other words, the latch 314 is enabled to capture a bit before the master/slave latches are clocked with a delayed edge signal.

Figure 4:
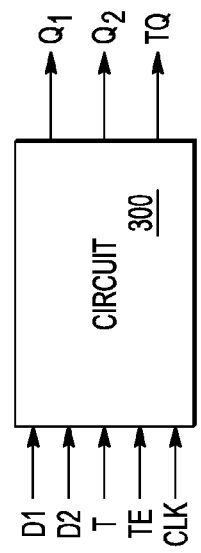
FIG. 4 illustrates in block diagram form a representation of the module of FIG. 3.

Illustrated in FIG. 4 is a block diagram representation of the flip-flop module circuit 300 of FIG. 3. The flip-flop module circuit 300 has two data bit inputs, D1 and D2, a test bit T input, a test enable TE input, a clock CLK input, data bit outputs Q1 and Q2 and a test bit output TQ. This block diagram is presented for representation in sequential digital circuitry 500 of FIG. 5.

Figure 5:
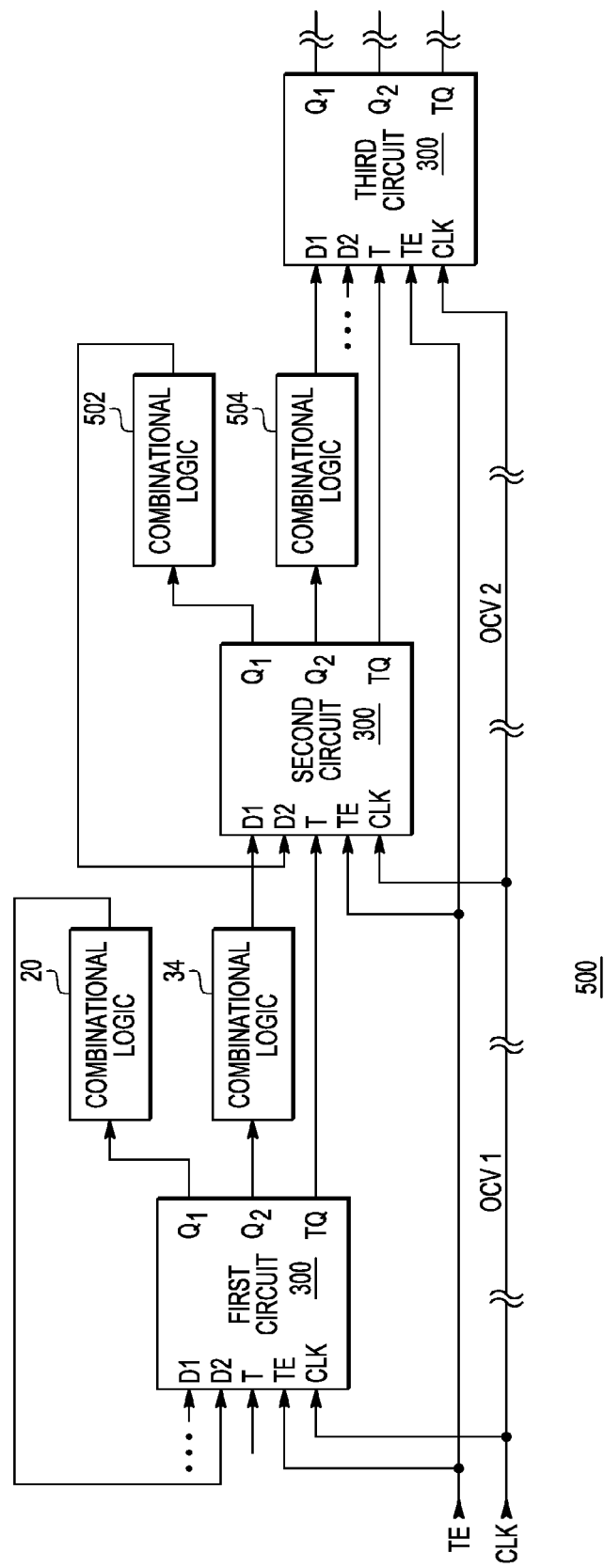
FIG. 5 illustrates in block schematic form sequential digital circuitry having test implemented in a single clock domain.

Illustrated in FIG. 5 is a block diagram of sequential digital circuitry 500 using the principles of the present invention. In the illustrated form, the sequential digital circuitry 500 implements three of the flip-flop module circuits 300 of FIG. 3, respectively designated as first, second and third. For purposes of providing a comparison to show how the sequential digital circuitry 500 is an improvement in size and power from the conventional circuitry of FIG. 1, combinational logic illustrated in FIG. 5 that is the same as the combinational logic of FIG. 1 is designated with the same reference number. A first flip-flop module circuit 300 receives a data bit D1 from circuitry not shown. A data bit D2 is provided from an output of combinational logic 20. A test bit T of predetermined logic value is coupled to the test input. A test enable (TE) signal is coupled to a test enable (TE) input and a clock signal (CLK) is coupled to a clock (CLK) input of the first flip-flop module circuit 300. A first data output, Q1, is coupled to an input of the combinational logic 20. A second data output, Q2, is coupled to an input of combinational logic 34. An output of the combinational logic 34 is coupled to a first data input D1 of a second flip-flop module circuit 300. A second data input of the second flip-flop module circuit 300 is coupled to an output combinational logic 502. A test output, TQ, of the first flip-flop module circuit 300 is coupled to a test input, T, of the second flip-flop module circuit 300. The test enable (TE) signal is coupled to a test enable input of the second flip-flop module circuit 300 and the clock (CLK) signal is coupled to a clock input of the second flip-flop module circuit 300. A first data output, Q1, is coupled to an input of the combinational logic 502. A second data output, Q2, is coupled to an input of combinational logic 504. A test output, TQ, is coupled to a test input of a third flip-flop module circuit 300. An output of the combinational logic 504 is coupled to a first data input, D1, of the third flip-flop module circuit 300. Data from an un-illustrated source is coupled to a second data input, D2, of the third flip-flop module circuit 300. The test enable (TE) signal is coupled to a test enable (TE) input of the third flip-flop module circuit 300 and the clock (CLK) signal is coupled to a clock (CLK) input of the third flip-flop module circuit 300. The third flip-flop module circuit 300 has first and second data outputs, Q1 and Q2, respectively, and a test output, TQ, that are respectively coupled to further circuitry (not shown). In the region around the first flip-flop module circuit 300 and the combinational logic 20 and 34, the clock signal has a first on-chip variation designated as OCV1. In the region around the second flip-flop module circuit 300 and the combinational logic 502 and the combinational logic 504, the clock signal has a second on-chip variation designated as OCV2.

In operation, the sequential digital circuitry 500 has both a test mode and a functional mode of operation. In the test mode of operation, a test bit T is sequentially clocked through the first flip-flop module circuit 300, the second flip-flop module circuit 300, and the third flip-flop module circuit 300. The generated output TQ is checked for proper functionality with a predetermined expected result based on the value of the input test bit T. In the data mode of operation, a data bit D1 is initially provided from a source not shown. The initial value of the data bit D2 is the output of the combinational logic 20. In a system which uses a plurality of circuits such as flip-flop module circuit 300, significant power savings is accomplished because there is no requirement for inserting delay circuitry between the test output TQ of the first flip-flop module circuit 300 and the test input of the second flip-flop module circuit 300 in parallel with the combinational logic 20 and combinational logic 34. Clocked latch circuits which dissipate power are also eliminated in parallel with the combinational logic 20 and combinational logic 34, for example. In addition to the power savings which are realized from not requiring these circuits, area or space savings are also realized. Also no extra design cycle time is required to fix the hold time requirement violation of the test signals that are typically associated with the semiconductor design phase of digital circuit 10 and digital circuit 100.

Figure 6:
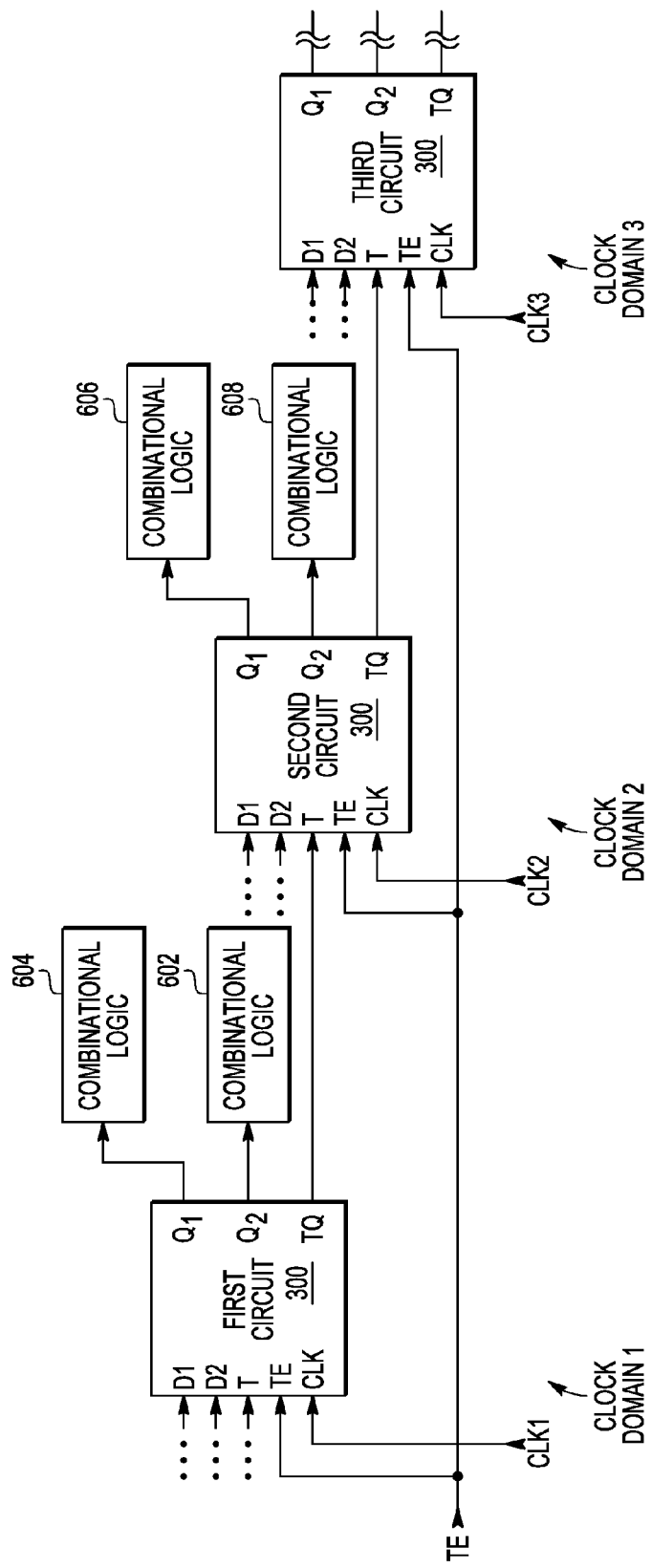
FIG. 6 illustrates in block schematic form sequential digital circuitry having test implemented in a multiple clock domain.

Illustrated in FIG. 6 is a block diagram of sequential digital circuitry 600 using the principles of the present invention with separate clock circuits for each of a plurality of flip-flop module circuits 300. In the illustrated form, the sequential digital circuitry 600 implements three of the flip-flop module circuits 300 of FIG. 3. For convenience, the representation of FIG. 4 is used. A first flip-flop module circuit 300 receives a first data bit D1 from circuitry not shown. The first flip-flop module circuit 300 also receives a second data bit D2 from circuitry not shown. The first flip-flop module circuit 300 receives a test bit T of predetermined logic value from circuitry not shown. A test enable (TE) signal is coupled to a test enable (TE) input and a first clock signal (CLK1) of a first clock domain is coupled to a clock (CLK) input of the first flip-flop module circuit 300. A first data output, Q1, is coupled to an input of the combinational logic 604. A second data output, Q2, is coupled to an input of combinational logic 602. A second flip-flop module circuit 300 receives a first data bit D1 from circuitry not shown. The second flip-flop module circuit 300 also receives a second data bit D2 from circuitry not shown. A test output, TQ, of the first flip-flop module circuit 300 is coupled to a test input, T, of the second flip-flop module circuit 300. The test enable (TE) signal is coupled to a test enable input of the second flip-flop module circuit 300 and a second clock signal (CLK2) of a second clock domain is coupled to a clock input of the second flip-flop module circuit 300. A first data output, Q1, is coupled to an input of the combinational logic 606. A second data output, Q2, is coupled to an input of combinational logic 608. A test output, TQ, is coupled to a test input of a third flip-flop module circuit 300. A third flip-flop module circuit 300 receives a first data bit D1 from circuitry not shown. The third flip-flop module circuit 300 also receives a second data bit D2 from circuitry not shown. A test output, TQ, of the second flip-flop module circuit 300 is coupled to a test input, T, of the third flip-flop module circuit 300. The test enable (TE) signal is coupled to a test enable input of the third flip-flop module circuit 300 and a third clock signal (CLK3) of a third clock domain is coupled to a clock input of the third flip-flop module circuit 300. The third flip-flop module circuit 300 has first and second data outputs, Q1 and Q2, respectively, and a test output, TQ, that are respectively coupled to further circuitry (not shown).

In operation, the sequential digital circuitry 600 functions in both a test mode and a functional mode as described above for the sequential digital circuitry 500. In this form both data bits for the first flip-flop module circuit 300 are provided from sources not identified. The first data output bit Q1 of the first flip-flop module circuit 300 and second flip-flop module circuit 300 are respectively input to combinational logic 604 and combinational logic 606 and are not further propagated through the illustrated serial chain. In other respects, the operation of the sequential digital circuitry 600 is analogous to that described above for the sequential digital circuitry 500 and will not be repeated. In a system which uses a plurality of circuits such as flip-flop module circuit 300, significant power savings is also accomplished in the sequential digital circuitry 600 because there is no requirement for inserting delay circuitry between the test output TQ of the first flip-flop module circuit 300 and the test input of the second flip-flop module circuit 300 in parallel with the combinational logic 602 and combinational logic 608. Clocked latch circuits which dissipate power are also eliminated in parallel with the combinational logic 602 and combinational logic 608, for example. In addition to the power savings which are realized from not requiring these circuits, area or space savings are also realized. In the test mode of operation the frequency of CLK1, CLK2 and CLK3 is substantially the same but the phase of the clock signals may and likely will differ. In the functional mode of operation the frequency of the three illustrated clocks may or may not have the same frequency. In the functional mode of operation, the phase relationships may and likely will differ. However, the sequential digital circuit 600 ensures that phase variation of the clock signals in the differing clock domains does not degrade the system operation.

Figure 7:
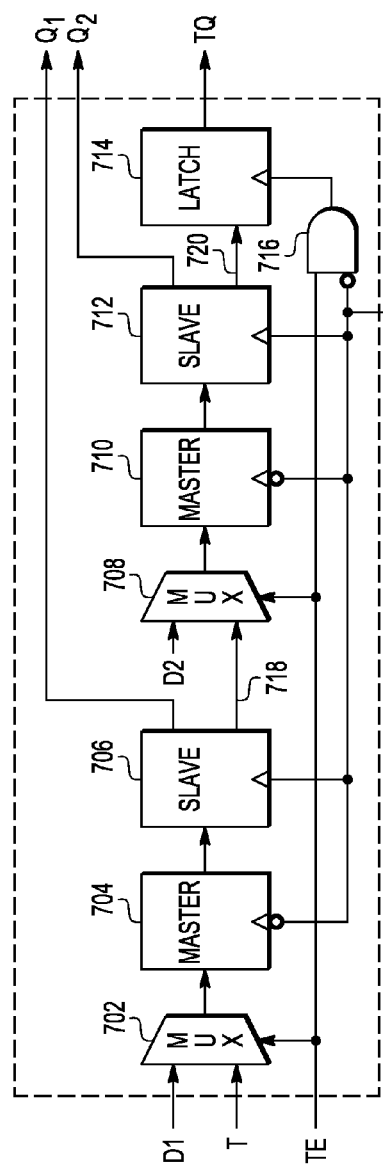
FIG. 7 illustrates in block schematic form another form of a module of a multiplexed flip-flop with a latch in accordance with principles of the present invention.

Illustrated in FIG. 7 is a block diagram of sequential digital circuitry 700 which represents another form of the sequential digital flip-flop module circuit 300 of FIG. 3. A multiplexer 702 has a first input for receiving a data bit D1 from an undesignated source, a second input for receiving a test bit T, an enable input for receiving a test enable (TE) signal, and an output coupled to an input of a master latch 704. An output of the master latch 704 is connected to an input of a slave latch 706. A first output of the slave latch 706 provides a first output Q1. A second output of the slave latch 706 provides a test output 718. A multiplexer 708 has a first input for receiving a data bit D2 from an undesignated source. A control input of the multiplexer 708 is connected to the test enable (TE) signal. An output of the multiplexer 708 is connected to an input of a master latch 710. An output of the master latch 710 is connected to an input of a slave latch 712. A first output of the slave latch 712 provides a second output Q2. A second output of the slave latch 714 provides a test output TQ. An AND gate 716 has a first input connected to the test enable (TE) signal and an active low input connected to a system clock (CLK) signal. The system clock signal is also connected to an active low clock input of each of the master latch 704 and the master latch 710. The system clock signal is further connected to an active high clock input of each of the slave latch 706 and the slave latch 712.

In operation, the sequential digital circuitry 700 differs from the sequential digital flip-flop module circuit 300 by having two different output signals provided by each of the slave latches 706 and 712 rather than a single output signal. Logically, the two outputs of slave latch 706 are the same, and the two outputs of slave latch 712 are the same. However, the test output 718 and test output 720 are further buffered by their respective slave latch to provide more delay and robustness for the serial propagation of the test signal.

Figure 8:
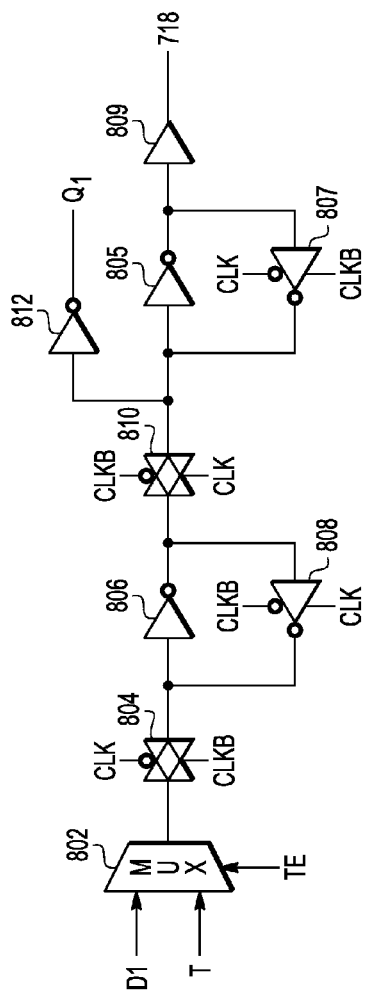
FIG. 8 illustrates in partial schematic form exemplary circuitry to implement a multiplexed master/slave latch illustrated in FIG. 7.

Illustrated in FIG. 8 is a circuit 800 that is a schematic diagram of an exemplary implementation of the multiplexer 702, master latch 704 and slave latch 706 having two outputs of FIG. 7. A multiplexer 802 that is equivalent to multiplexer 702 has a first input for receiving data bit D1 and a second input for receiving test bit T. A control input of the multiplexer 802 is connected to the Test Enable (TE) signal. An output of the multiplexer 802 is connected to a first terminal of a transistor switch 804. In one form the transistor switches described herein are conventional CMOS (complementary metal oxide semiconductor) transmission gates. An active low input of the switch 804 is connected to the system clock (CLK) signal. An active high input of the switch 804 is connected to an inverse or complement (CLKB) of the system clock signal. A second terminal of the switch 804 is connected to an input of an inverter 806. An output of inverter 806 is connected to a first terminal of a transistor switch 808. An active low control input of transistor switch 808 is connected to the complement (CLKB) of the system clock signal. An active high input of the transistor switch 808 is connected to the system clock (CLK) signal. A second terminal of the transistor switch 808 is connected to the second terminal of transistor switch 804 and the input of inverter 806. The output of inverter 806 is also connected to a first terminal of a transistor switch 810. A second terminal of transistor switch 810 is connected to a first input of an inverter 812 and to an input of an inverter 805. An active low control terminal of the transistor switch 810 is connected to the complement (CLKB) of the system clock signal. An active high control terminal of the transistor switch 810 is connected to the system clock (CLK) signal. A second terminal of the inverter 812 provides the data output Q1 from the slave latch 706. An output of the inverter 805 is connected to a first terminal of an inverting transistor switch 807. A second terminal of the inverting transistor switch 807 is connected to the input of inverter 805. An active low control terminal of the inverting transistor switch 807 is connected to the system clock (CLK) signal. An active high control terminal of the inverting transistor switch 807 is connected to a complement (CLKB) of the system clock signal. An output of the inverter 805 is connected to an input of a buffer circuit 809. An output of the buffer circuit 809 provides the test output 718 which is the second output of the slave latch 706.

In operation, the system clock signal transitions propagate the selected one of the data bit D1 or the test bit T into the master latch which is formed by inverter 806 and inverting transistor switch 808. The signal further propagates into the slave latch formed by inverter 805 and the inverting switch 807. The buffer 809 adds drive strength to the output of the slave latch. It should be well understood that other implementations of the master and slave latch portion with two outputs can be readily implemented.

Figure 9:
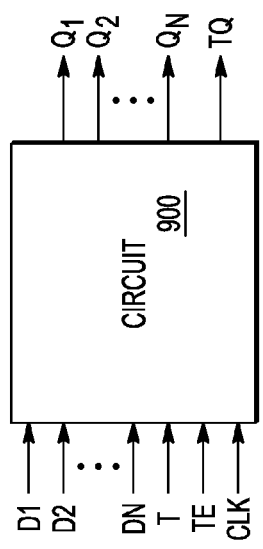
FIG. 9 illustrates in block diagram form a module of sequential digital circuitry with test having multiple data inputs.

Illustrated in FIG. 9 is a sequential digital circuit 900 in accordance with principles of the present invention. A block representation of a sequential digital circuit 900 having a plurality of n data bit inputs (D1, D2 . . . DN), N data bit outputs (Q1, Q2 . . . QN), a test bit input (T), a test enable bit (TE), a clock signal (CLK), and a test bit output (TQ) is illustrated in FIG. 9. The implementation of the sequential digital circuit 900 will be described immediately below. The block diagram form of FIG. 9 represents a sequential digital circuit which is capable of efficiently serially propagating a test bit through a plurality of stages of multiplexed master/slave latches which are terminated by a latch. Sequential digital circuit 900 illustrates that any number of input bits may be used to provide an efficient sequential digital circuit. The sequential digital circuit 900 may be used in either the sequential digital circuitry 500 of FIG. 5 or the sequential digital circuitry 600 of FIG. 6 in lieu of each use of flip-flop module circuit 300. Additional combinational logic circuitry would be connected to any additional data bit outputs QN not shown in sequential digital circuitry 500 or sequential digital circuitry 600.

Figure 10:
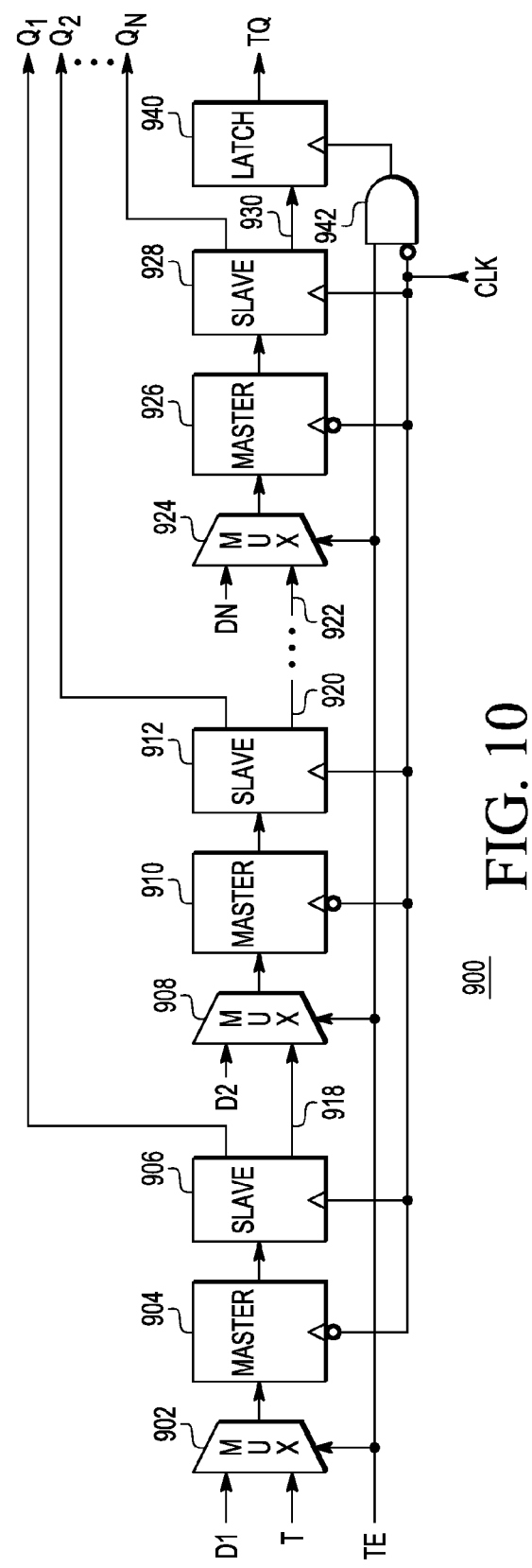
FIG. 10 illustrates in block diagram form an exemplary circuit for implementing the module of FIG. 9.

Illustrated in FIG. 10 in block diagram form is one form of the sequential digital circuit 900 of FIG. 9. A first data bit D1 is coupled to a first input of a multiplexer 902. A test bit T is coupled to a second input of the multiplexer 902. An output of multiplexer 902 is connected to a master latch 904. An output of master latch 904 is connected to an input of a slave latch 906. A first output of the slave latch 906 provides the first output data bit Q1. The slave latch 906 provides a second output 918. A multiplexer 908 has a first input coupled to a second data bit D2. A second input of the multiplexer 908 is connected to the second output of the slave latch 906. An output of the multiplexer 908 is connected to an input of a master latch 910. An output of the master latch 910 is connected to an input of a slave latch 912. A first output of the slave latch 912 provides a second output data bit Q2. The slave latch 912 provides a second output 920 that is connected to an input of an intervening multiplexer (not shown). Any number of intervening serially connected multiplexer/master latch/slave latch circuits may be implemented as indicated by the dots in FIG. 10. In an Nth stage, where N is an integer, a multiplexer 924 has a first input for receiving an Nth data bit DN. A second input of multiplexer 924 is connected to a signal 922 from an immediately preceding slave latch (not expressly shown). An output of the multiplexer 924 is connected to an input of a master latch 926. An output of the master latch 926 is connected to an input of a slave latch 928. A first output of the slave latch 928 provides an Nth data bit, QN. A second output of the slave latch 928 provides a signal 930. The signal 930 is connected to an input of a latch 940. An output of the latch 940 provides a test output bit, TQ. A test enable (TE) signal is connected to a control input of each of multiplexer 902, multiplexer 908, multiplexer 924 and a first input of an AND gate 942. A system clock signal is connected to an active low clock input of each of master latch 904, master latch 910 and master latch 926 and to an active high clock input of each of slave latch 906, slave latch 912 and slave latch 928. The system clock signal is also connected to an active low input of AND gate 942.

In operation, multiple data bits D1, D2 . . . DN are provided to the sequential digital circuit 900. In a test mode of operation, the test enable, TE, signal is a control signal that controls all of the illustrated multiplexers to route the test bit T or the second output of the slave latch through the multiplexer. The AND gate 942 permits the latch 940 to be clocked only in the test mode and this directly results in lower power consumption during the functional mode. The hold latch 940 delays the output launch of the TQ signal until the falling edge of CLK. As a result, there is now an additional phase of hold margin relative to the receiving flip-flop (not shown) which captures the test input T at the rising edge of CLK. The added phase delay is not an issue for setup margin because there is little or no combinational logic in the test path between sequential elements. Hence, setup-related timing of the TQ signal is relatively easy to meet in test mode.

In each of the various embodiments, the drive strength of the master latch and slave latch circuits is application specific. A significant number of applications require a high drive strength to provide robust digital signals at the outputs. As a result, a standard cell library can contain various instantiations of the sequential digital circuits described herein which vary in the amount of drive strength (i.e. signal amplification). In the prior art circuits of FIGS. 1 and 2, as higher drive strength master and slave latches are selected, more delay insertion is needed in the test path. Thus a large amount of area is consumed when high drive strength master/slave latches are implemented. However, by eliminating these delay circuits, the various embodiments described herein do not encounter this disadvantage. Additionally, as the drive strength of the master/slave latches is increased by making those latches physically larger, the area required to implement the output latches, such as latch 314, latch 714 and latch 940, represents a significantly smaller percentage of the overall module area for the sequential digital circuit.

Digital circuits are routinely implemented by function as elements or images in a design library to assist in the automation of integrated circuit design. To implement the prior art circuits of FIG. 1 or FIG. 2, a number of standard cells are required to implement the circuit. For example, a standalone cell is required to implement each multiplexed flip-flop circuit. Another standalone cell is required to implement each inserted delay circuit. The use of multiple cells to create the functionality of each of FIG. 1 and FIG. 2 results in larger circuit layout area and additional conductive routing to be implemented external to the cells in the designer's library of cells. Thus, the standard cell library tools of the prior art circuits of FIG. 1 and FIG. 2 are inefficient and less cost effective. In contrast, the embodiments of the various sequential digital circuit modules that are described herein may be implemented in one standard cell element for a design library. By using a single cell, a compact contiguous layout may be easily implemented in a standard cell library. For example, the contiguous layout in one cell can readily implement various instantiations of the entire functionality of sequential digital circuits of FIG. 3 or FIG. 7 wherein each instantiation represents a different drive strength for the master/slave latches. When multiple digital flip-flop modules are implemented, each of the plurality of flip-flop modules can be readily implemented in a design by a single library element of a cell library which results in a compact and size-efficient design.

By now it should be appreciated that there has been provided a sequential digital circuit with a test mode. Test bit hold timing problems in a scan chain path of multiplexed flip-flop structures is addressed while significantly reducing circuit area and power consumption. The disclosed multiplexed flip-flop circuits have a less complex clocking mechanism as compared with conventional serial digital paths using flip-flops. The sequential digital circuits described herein require no need to modify an initial circuit layout to accommodate compensating delay paths. An output latch for storage of the test bit is clocked by a same multiplexed master/slave latch circuit and is gated by a test enable control signal to eliminate switching power during a functional mode of operation. The described embodiments are effective at avoiding hold time violations (i.e. not holding a data or test bit a sufficiently long enough time for a latch circuit to capture the bit value) for test inputs to flip-flops configured in a scan-chain implementation. As a result of the disclosed structures, power consumption is reduced as well as the required circuit area.

There is herein provided in one form a digital scan chain system having test scan. A plurality of flip-flop modules is provided wherein each of the plurality of flip-flop modules has a first data bit input, a second data bit input, a test bit input, a clock input, a first data bit output, a second data bit output, and a test bit output. The test bit output of a first flip-flop module is directly connected to the test bit input of a second flip-flop module with no intervening circuitry. Each of the plurality of flip-flop modules has a first multiplexed master/slave flip-flop for multiplexing between the first data bit input and the test bit input and having an output for providing the first data bit output. A second multiplexed master/slave flip-flop multiplexes between the second data bit input and the output of the first multiplexed master/slave flip-flop and has an output for providing the second data bit output. A latch has an input coupled to the output of the second multiplexed master/slave flip-flop and an output for providing the test bit output and a clock input. A logic gate has a first input for receiving a clock signal, a second input for receiving a test enable signal, and an output coupled to the clock input of the latch for selectively clocking the latch only during a test mode. In another form there is provided first combinational logic having an input coupled to the second data bit output of a first flip-flop module of the plurality of flip-flop modules, and having an output coupled to the first data bit input of a second flip-flop module of the plurality of flip-flop modules. The first flip-flop module has the test bit output thereof directly connected to the test bit input of the second flip-flop module. In another form there is provided second combinational logic having an input coupled to the first data bit output of the first flip-flop module of the plurality of flip-flop modules, and having an output coupled to the second data bit input thereof. In another form the clock signal is coupled to clock inputs of each of a master latch and a slave latch of each of the first multiplexed master/slave flip-flop and the second multiplexed master/slave flip-flop. In yet another form a first clock signal is coupled to the clock input of each of the first flip-flop module, and a second clock signal is coupled to the clock input of the second flip-flop module, wherein the digital scan chain system comprises two clock domains. In another form the two clock domains use a same frequency clock during the test mode and a differing clock frequency during a functional mode.

In yet another form there is herein provided a digital scan chain system having test scan and having a plurality of flip-flop modules. Each of the plurality of flip-flop modules has a first data bit input, a second data bit input, a test bit input, a clock input, a first data bit output, a second data bit output, and a test bit output, wherein the test bit output of a first flip-flop module is directly connected to the test bit input of a second flip-flop module with no intervening circuitry. Each of the plurality of flip-flop modules is a single library element for a cell library. Each of the plurality of flip-flop modules has a first multiplexed master/slave flip-flop for multiplexing between the first data bit input and the test bit input and has an output for providing the first data bit output. A second multiplexed master/slave flip-flop multiplexes between the second data bit input and the output of the first multiplexed master/slave flip-flop, and has a first output for providing the second data bit output and a second output. A latch has an input coupled to the second output of the second multiplexed master/slave flip-flop, an output for providing the test bit output and a clock input. A logic gate has a first input for receiving a clock signal, a second input for receiving a test enable signal, and an output coupled to the clock input of the latch for selectively clocking the latch only during a test mode. In another form there is provided first combinational logic having an input coupled to the second data bit output of a first flip-flop module of the plurality of flip-flop modules, and having an output coupled to the first data bit input of a second flip-flop module of the plurality of flip-flop modules. The first flip-flop module has the test bit output thereof directly connected to the test bit input of the second flip-flop module. In another form there is provided second combinational logic having an input coupled to the first data bit output of the first flip-flop module of the plurality of flip-flop modules, and having an output coupled to the second data bit input thereof. In yet another form the clock signal is coupled to clock inputs of each of a master latch and a slave latch of each of the first multiplexed master/slave flip-flop and the second multiplexed master/slave flip-flop. In yet another form a first clock signal is coupled to the clock input of the first flip-flop module, and a second clock signal is coupled to the clock input of the second flip-flop module, wherein the digital scan chain system has two clock domains. In another form the two clock domains use a same frequency clock during the test mode and a differing clock frequency during a functional mode. In yet another form there is provided a digital scan chain system having test scan and having a plurality of flip-flop modules. Each of the plurality of flip-flop modules has a first data bit input, a second data bit input, a test bit input, a clock input, a first data bit output, a second data bit output, and a test bit output. The test bit output of a first flip-flop module is directly connected to the test bit input of a second flip-flop module with no intervening circuitry. Each of the plurality of flip-flop modules has a plurality of multiplexed master/slave flip-flops, each for multiplexing between a predetermined differing data bit input and the test bit input and having an output for providing a respective data bit output, only a last of the plurality of multiplexed master/slave flip-flops being coupled to a selectively clocked latch for providing the test bit output and being clocked only during a test mode. In another form for each of the plurality of multiplexed master/slave flip-flops, the test bit output and the data bit output are two separate outputs provided by a slave latch. In another form each of the plurality of multiplexed master/slave flip-flops is clocked by a same clock signal. In yet another form a test control signal is asserted during the test mode and activates clocking of the selectively clocked latch by controlling a logic gate coupled to a clock input of the selectively clocked latch. In yet another form each flip-flop module except a last in the digital scan chain system has a separate combinational logic circuit coupled between a predetermined data bit output and a predetermined data bit input thereof. In yet another form the plurality of flip-flop modules are sequential from a first propagating to a last propagating module and each flip-flop module except a last in the digital scan chain system has a separate combinational logic circuit coupled between a predetermined data bit output of an earlier propagating flip-flop module to an adjacent later propagating flip-flop module. In yet another form each of the plurality of flip-flop modules is clocked by a different clock from a different clock domain, each different clock having a same frequency at least during the test mode. In yet another form at least two clocks within the digital scan chain system each have a differing frequency during a function mode of the digital scan chain system.

Although the invention has been described with respect to specific conductivity types or polarity of potentials, skilled artisans appreciate that conductivity types and polarities of potentials may be reversed. For example, any of a variety of multiplexer circuits may be used to implement the multiplexing function.

The term "coupled," as used herein, is not intended to be limited to a direct coupling or a mechanical coupling. Although the invention is described herein with reference to specific embodiments, various modifications and changes can be made without departing from the scope of the present invention as set forth in the claims below. For example, various types of transistors which are used to implement the illustrated circuit functions may be implemented, such as MOS (metal oxide semiconductor), bipolar, GaAs, silicon on insulator (SOI) and others. The amount of power supply voltage reduction can be adjusted according to specific application requirements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital scan chain system having test scan comprising:
a plurality of flip-flop modules, each of the plurality of flip-flop modules having a first data bit input, a second data bit input, a test bit input, a clock input, a first data bit output, a second data bit output, and a test bit output, wherein the test bit output of a first flip-flop module is directly connected to the test bit input of a second flip-flop module with no intervening circuitry, a first of the plurality of flip-flop modules comprising:
a first multiplexed master/slave flip-flop for multiplexing between the first data bit input and the test bit input, a clock input for receiving a first clock, and having an output for providing the first data bit output;
a second multiplexed master/slave flip-flop for multiplexing between the second data bit input and the output of the first multiplexed master/slave flip-flop, a clock input for receiving the first clock, and having an output for providing the second data bit output;
a latch having an input coupled to the output of the second multiplexed master/slave flip-flop, an output for providing the test bit output, and a clock input; and
a logic gate having a first input for receiving the first clock signal, a second input for receiving a test enable signal, and an output coupled to the clock input of the latch for selectively clocking the latch only during a test mode, wherein the first clock is placed closer to the logic gate than to the clock input of each of the first and second multiplexed master/slave flip-flops so that the first clock transitions earlier at the logic gate than at the first multiplexed master/slave flip-flop.

2. The digital scan chain system of claim 1 further comprising:
first combinational logic having an input coupled to the second data bit output of first flip-flop module of the plurality of flip-flop modules, and having an output coupled to a first data bit input of a second flip-flop module of the plurality of flip-flop modules, the first flip-flop module having the test bit output thereof directly connected to a test bit input of the second flip-flop module.

3. The digital scan chain system of claim 2 further comprising:
second combinational logic having an input coupled to the first data bit output of the first flip-flop module of the plurality of flip-flop modules, and having an output coupled to the second data bit input thereof.

4. The digital scan chain system of claim 1 wherein the clock signal is coupled to clock inputs of each of a master latch and a slave latch of the second multiplexed master/slave flip-flop.

5. The digital scan chain system of claim 1 wherein a second clock signal is coupled to the clock input of the second flip-flop module, wherein the digital scan chain system comprises two clock domains.

6. A digital scan chain system having test scan comprising:
a plurality of flip-flop modules, each of the plurality of flip-flop modules having a first data bit input, a second data bit input, a test bit input, a clock input, a first data bit output, a second data bit output, and a test bit output, wherein the test bit output of a first flip-flop module is directly connected to the test bit input of a second flip-flop module with no intervening circuitry, a first of the plurality of flip-flop modules comprising:
a first multiplexed master/slave flip-flop for multiplexing between the first data bit input and the test bit input and having a first output for providing the first data bit output and a clock input for receiving a first clock;
a second multiplexed master/slave flip-flop for multiplexing between the second data bit input and the second data bit output of the first multiplexed master/slave flip-flop, and having a first output for providing the second data bit output and a second output and a clock input for receiving the first clock;

a latch having an input coupled to the second output of the second multiplexed master/slave flip-flop, an output for providing the test bit output, and a clock input; and a logic gate having a first input for receiving the first clock signal, a second input for receiving a test enable signal, and an output coupled to the clock input of the latch for selectively clocking the latch only during a test mode, wherein the first clock is placed closer to the logic gate than to the clock input of each of the first and second multiplexed master/slave flip-flops so that the first clock transitions earlier at the logic gate than at the first multiplexed master/slave flip-flop.

7. The digital scan chain system of claim 6 further comprising:

first combinational logic having an input coupled to the second data bit output of the first flip-flop module of the plurality of flip-flop modules, and having an output coupled to the first data bit input of a second flip-flop module of the plurality of flip-flop modules, the first flip-flop module having the test bit output thereof directly connected to the test bit input of the second flip-flop module.

8. The digital scan chain system of claim 7 further comprising:

second combinational logic having an input coupled to the first data bit output of the first flip-flop module of the plurality of flip-flop modules, and having an output coupled to the second data bit input thereof.

9. The digital scan chain system of claim 6 wherein the clock signal is coupled to clock inputs of a master latch and a slave latch of the the second multiplexed master/slave flip-flop.

10. The digital scan chain system of claim 6 wherein a second clock signal is coupled to the clock input of the second flip-flop module, wherein the digital scan chain system comprises two clock domains.

11. A digital scan chain system having test scan comprising:

a plurality of flip-flop modules, each of the plurality of flip-flop modules having a first data bit input, a second data bit input, a test bit input, a clock input, a first data bit output, a second data bit output, and a test bit output, wherein the test bit output of a first flip-flop module is directly connected to the test bit input of a second flip-flop module with no intervening circuitry, each of the plurality of flip-flop modules comprising a single library element for a cell library, a first of the flip-flop modules comprising:

a plurality of multiplexed master/slave flip-flops, each for multiplexing between a predetermined differing data bit input and the test bit input and having an output for providing a respective data bit output, only a last of the plurality of multiplexed master/slave flip-flops being coupled to a selectively clocked latch for providing the test bit output and being clocked only during a test mode, wherein:

the selectively clocked latch is clocked by a logic gate;
the logic gate is clocked by a first clock;
the first clock is placed closer to the logic gate than to the clock input of each of the plurality of multiplexed master/slave flip-flops so that the first clock transitions earlier at the logic gate than at the plurality of multiplexed master/slave flip-flops.

12. The digital scan chain system of claim 11 wherein for each of the plurality of multiplexed master/slave flip-flops the test bit output and the data bit output are two separate outputs provided by a slave latch.

13. The digital scan chain system of claim 11 wherein each of the plurality of multiplexed master/slave flip-flops is clocked by a same clock signal.

14. The digital scan chain system of claim 11 wherein a test control signal is asserted during the test mode and activates clocking of the selectively clocked latch.

15. The digital scan chain system of claim 11 wherein each flip-flop module except a last in the digital scan chain system has a separate combinational logic circuit coupled between a predetermined data bit output and a predetermined data bit input thereof.

16. The digital scan chain system of claim 11 wherein the plurality of flip-flop modules are sequential from a first propagating to a last propagating module and each flip-flop module except a last in the digital scan chain system has a separate combinational logic circuit coupled between a predetermined data bit output of an earlier propagating flip-flop module to an adjacent later propagating flip-flop module.

* * * * *